United States Patent
Gupta et al.

[11] Patent Number: 6,114,243
[45] Date of Patent: Sep. 5, 2000

[54] METHOD TO AVOID COPPER CONTAMINATION ON THE SIDEWALL OF A VIA OR A DUAL DAMASCENE STRUCTURE

[75] Inventors: Subhash Gupta; Kwok Keung Paul Ho; Mei-Sheng Zhou; Simon Chool, all of Singapore, Singapore

[73] Assignee: Chartered Semiconductor Manufacturing Ltd, Singapore, Singapore

[21] Appl. No.: 09/439,361

[22] Filed: Nov. 15, 1999

[51] Int. Cl.$^7$ .................................................. H01L 21/44
[52] U.S. Cl. ......................... 438/687; 438/633; 438/638; 438/648; 438/656; 438/666; 438/685; 438/668; 438/669; 438/671; 438/672
[58] Field of Search .................................... 438/638, 633, 438/648, 656, 685, 687, 666, 668, 669, 671, 672

[56] References Cited

U.S. PATENT DOCUMENTS

| | | | |
|---|---|---|---|
| 5,262,354 | 11/1993 | Cote et al. | 216/18 |
| 5,300,813 | 4/1994 | Joshi et al. | 257/752 |
| 5,371,047 | 12/1994 | Greco et al. | 438/623 |
| 5,403,779 | 4/1995 | Joshi et al. | 438/634 |
| 5,423,939 | 6/1995 | Bryant et al. | 216/18 |
| 5,451,551 | 9/1995 | Krishnan et al. | 437/241 |
| 5,470,789 | 11/1995 | Misawa | 437/190 |
| 5,595,937 | 1/1997 | Mikagi | 438/626 |
| 5,693,563 | 12/1997 | Teong | 437/190 |
| 5,731,245 | 3/1998 | Joshi et al. | 438/705 |
| 5,744,376 | 4/1998 | Chan et al. | 437/190 |
| 5,814,557 | 9/1998 | Venkatraman et al. | 438/622 |
| 5,886,411 | 3/1999 | Kohyama | 257/774 |
| 5,891,804 | 4/1999 | Havemann et al. | 438/674 |
| 5,939,788 | 8/1999 | McTeer | 257/751 |
| 5,942,449 | 8/1999 | Meikle | 438/747 |
| 5,976,967 | 11/1999 | Wu | 438/618 |
| 5,981,377 | 11/1999 | Koyama | 438/633 |
| 6,001,733 | 12/1999 | Huang et al. | 438/633 |
| 6,004,188 | 12/1999 | Roy | 451/41 |
| 6,028,362 | 2/2000 | Omura | 257/774 |

*Primary Examiner*—John F. Niebling
*Assistant Examiner*—Lynne Gurley
*Attorney, Agent, or Firm*—George O. Saile; Rosemary L. S. Pike

[57] ABSTRACT

A new method to prevent copper contamination of the intermetal dielectric layer during via or dual damascene etching by forming a capping layer over the first copper metallization is described. A first copper metallization is formed in a dielectric layer overlying a semiconductor substrate wherein a barrier metal layer is formed underlying the first copper metallization and overlying the dielectric layer. The first copper metallization is planarized, then etched to form a recess below the surface of the dielectric layer. A conductive capping layer is deposited overlying the first copper metallization within the recess and overlying the dielectric layer. The conductive capping layer is removed except over the first copper metallization within the recess using one of several methods. An intermetal dielectric layer is deposited overlying the dielectric layer and the conductive capping layer overlying the first copper metallization. A via or dual damascene opening is etched through the intermetal dielectric layer to the conductive capping layer wherein the conductive capping layer prevents copper contamination of the intermetal dielectric layer during etching. The via or dual damascene opening is filled with a metal layer to complete electrical connections in the fabrication of an integrated circuit device.

28 Claims, 9 Drawing Sheets

METHOD TO AVOID COPPER CONTAMINATION ON THE SIDEWALL OF A VIA OR A DUAL DAMASCENE STRUCTURE

BACKGROUND OF THE INVENTION (1) Field of the Invention

The invention relates to a method of metallization in the fabrication of integrated circuits, and more particularly, to a method of avoiding contamination in copper metallization in the manufacture of integrated circuits.

(2) Description of the Prior Art

Copper metallization has become a future trend in integrated circuit manufacturing. However, copper contamination of the intermetal dielectric layer is a problem. For example, as shown in FIG. 1, a first copper metallization 23 has been formed in a dielectric layer 18. An intermetal dielectric layer 25 is formed over the first copper metallization. When a via 27 or a dual damascene opening is made through the intermetal dielectric layer 25 to the underlying first copper metallization 23, some of the underlying copper will be sputtered away and redeposit 29 onto the sidewall of the via or dual damascene opening. This will cause contamination of the intermetal dielectric layer. This contamination may lead to line-to-line shorts and will degrade device performance. It is desired to prevent copper contamination of the intermetal dielectric layer.

U.S. Pat. No. 5,451,551 to Krishnan et al teaches a method of forming a titanium tungsten cap over copper and polishing away the excess capping layer. U.S. Pat. No. 5,470,789 to Misawa shows a titanium nitride layer that is buff-abraded. These two patents teach a similar capping layer to that in the present invention. However, since the step height between the open area and the copper recess is not large, the CMP (or buff abrasion) removal selectivity between the open area and the recessed area will also be small. As over-polishing is needed to remove the conductive capping layer between trenches, it is very likely that all of the conductive cap material on some of the trenches will be removed during over-polishing. U.S. Pat. No. 5,693,563 to Teong shows a barrier layer for copper, but the copper metallization is not recessed. U.S. Pat. No. 5,744,376 to Chan et al discloses a capping layer over a non-recessed copper metallization. U.S. Pat. No. 5,731,245 to Joshi et al teaches a hard cap for a tungsten plug process. U.S. Pat. No. 5,814,557 to Venkatraman et al forms a capping layer over a non-recessed copper layer.

SUMMARY OF THE INVENTION

A principal object of the present invention is to provide an effective and very manufacturable method of copper metallization in the fabrication of integrated circuit devices.

Another object of the invention is to provide a dual damascene copper metallization process.

Yet another object of the invention is to prevent copper contamination of the intermetal dielectric layer during etching.

Yet another object of the invention is to prevent copper contamination of the intermetal dielectric layer during via or dual damascene etching.

A still further object of the invention is to prevent copper contamination of the intermetal dielectric layer during via or dual damascene etching by forming a capping layer over the first copper metallization.

In accordance with the objects of this invention a new method to prevent copper contamination of the intermetal dielectric layer during via or dual damascene etching by forming a capping layer over the first copper metallization is achieved. A first copper metallization is formed in a dielectric layer overlying a semiconductor substrate wherein a barrier metal layer is formed underlying the first copper metallization and overlying the dielectric layer. The first copper metallization is planarized, then etched to form a recess below the surface of the dielectric layer. A conductive capping layer is deposited overlying the first copper metallization within the recess and overlying the dielectric layer. The conductive capping layer is removed except over the first copper metallization within the recess using one of several methods.

In one method, a spin-on material is coated over the conductive capping layer. The spin-on material and the conductive capping layer over the dielectric layer are etched back and then the spin-on material is removed leaving the conductive capping layer only over the first copper metallization in the recess. In another method, a mask is formed over first copper metallization area using a reverse of the mask used to form the first copper metallization area or using the mask used to form the first copper metallization area and a reverse tone resist. The conductive capping layer is etched away where it is not covered by the mask leaving the conductive capping layer only over the first copper metallization in the recess. In a third method, the conductive capping layer is partially polished away so that it is thicker over the first copper metallization then over the dielectric layer. Then, the conductive capping layer and barrier metal layer overlying dielectric layer are etched back leaving the conductive capping layer only over the first copper metallization within the recess.

An intermetal dielectric layer is deposited overlying the dielectric layer and the conductive capping layer overlying the first copper metallization. A via or dual damascene opening is etched through the intermetal dielectric layer to the conductive capping layer wherein the conductive capping layer prevents copper contamination of the intermetal dielectric layer during etching. The via or dual damascene opening is filled with a metal layer to complete electrical connections in the fabrication of an integrated circuit device.

BRIEF DESCRIPTION OF THE DRAWINGS

In the accompanying drawings forming a material part of this description, there is shown:

FIGS. 7, 8, 11 and 12 schematically illustrate in cross-sectional representation a second preferred embodiment of the present invention.

DESCRIPTION OF THE PREFERRED EMBODIMENTS

The present invention provides a method for preventing contamination of an intermetal dielectric layer by copper from an underlying copper interconnect during etching of a via or dual damascene opening during metallization.

Figure 1:
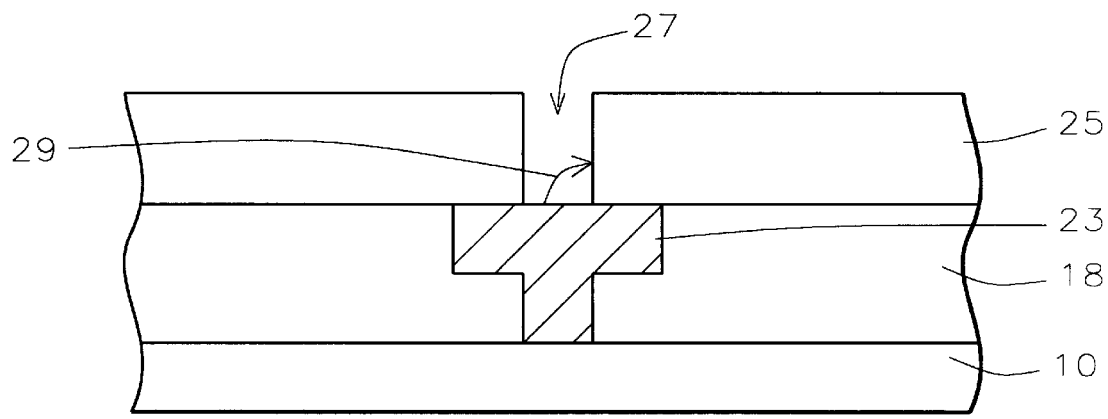
FIG. 1 schematically illustrates in cross-sectional representation copper contamination in a process of the prior art.
Figure 2:
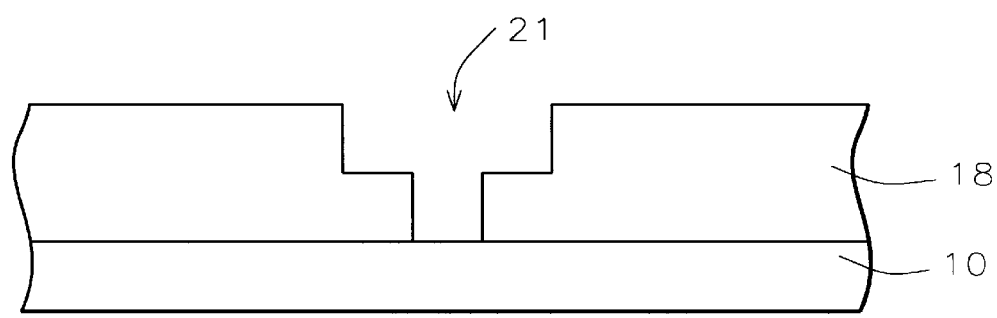
FIGS. 2 through 6 schematically illustrate in cross-sectional representation a process of the present invention.

Referring now more particularly to FIG. 2, there is illustrated a portion of a partially completed integrated circuit device. There is shown a semiconductor substrate 10, preferably composed of monocrystalline silicon. An intermetal dielectric (IMD) or interlevel dielectric (ILD) layer 18 is deposited on the substrate wafer. Semiconductor devices structures, such as gate electrodes, source and drain regions, or metal interconnects, not shown, may be formed in and on the semiconductor substrate and covered by the IMD or ILD layer 18.

Now, a dual damascene opening 21 is patterned into the IMD or ILD layer 18. The patterning may be done by any conventional method, including via first, trench first, or embedded via.

Figure 3:
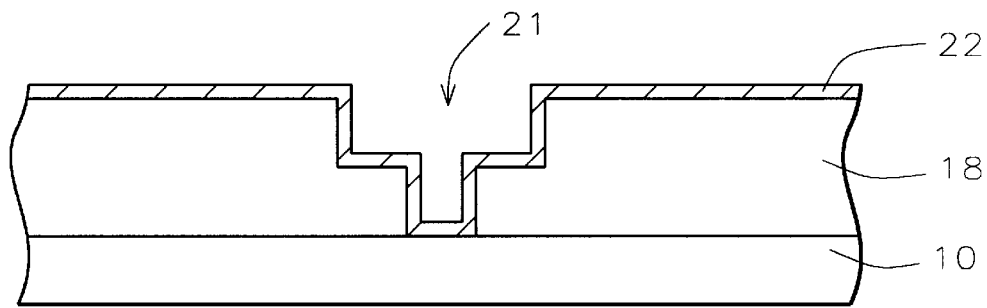

Referring now to FIG. 3, a barrier metal layer 22 is deposited over the IMD or ILD layer 18 and within the opening 21. The barrier metal layer may comprise, for example, tantalum or a tantalum compound, titanium or a titanium compound, or tungsten or a tungsten compound, and may have a thickness of between about 50 and 2000 Angstroms.

Figure 4:
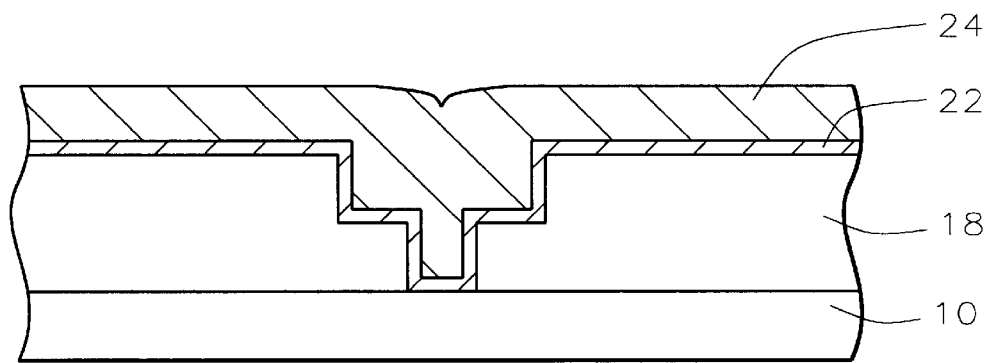

A copper layer 24 is formed over the barrier metal layer 22, as shown in FIG. 4, by any of the conventional means, including physical or chemical vapor deposition, electrochemical plating (ECP), or electroless plating, and so on.

Figure 5:
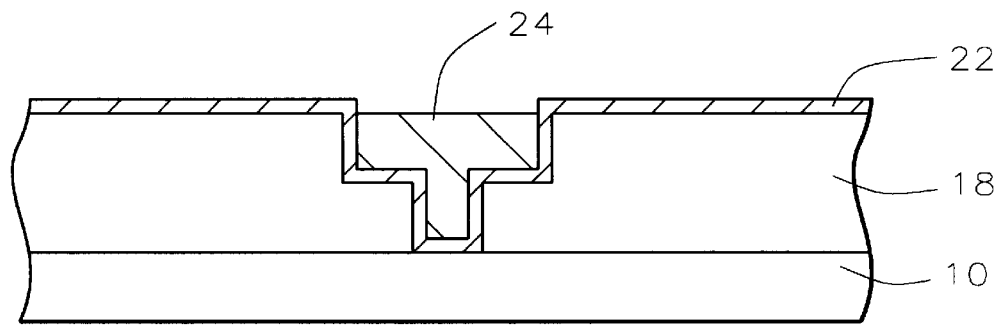

The excess copper layer over the IMD or ILD layer is polished off by chemical mechanical polishing (CMP), for example, as shown in FIG. 5. The barrier metal layer 22 can be used as a polish stop layer for the CMP process. Alternately, the bulk copper film is partially removed by CMP until the surface is planarized and only a thin uniform layer of copper is left on the wafer surface.

Figure 6:
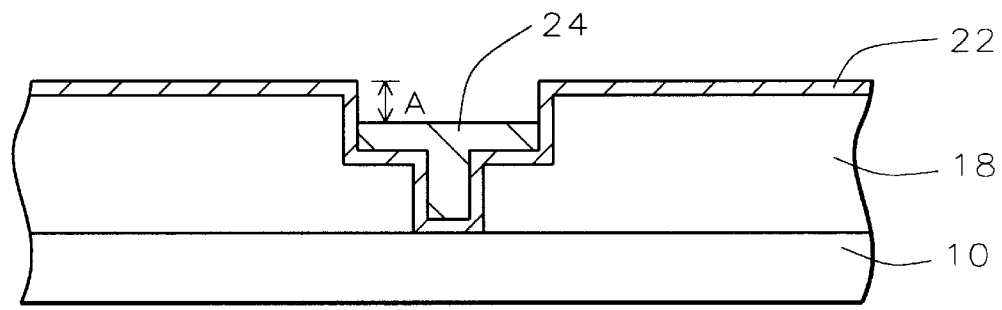

Referring now to FIG. 6, the copper 24 in the trench is partially stripped by a wet chemistry; for example, using the conventional $CH_3COOH/NH_4F$ or $CCl_4/DMSO$ chemistry, or any other chemistry, to form a recess A. This recess may have a depth of between about 100 and 2000 Angstroms for a dual damascene opening depth of between about 2000 and 20,000 Angstroms.

Now, a capping layer is to be formed over the first copper metallization to prevent copper contamination of the overlying IMD layer during the next level of metallization. Three preferred embodiments of the invention for forming this capping layer will be described. The methods of removing the capping layer between trenches have high selectivity, unlike the prior art methods, so that the capping layer on the trenches will not be removed. The first embodiment will be described with reference to FIGS. 7–10. The second embodiment will be described with reference to FIGS. 7, 8, 11, and 12. The third embodiment will be described with reference to FIGS. 13–15.

Figure 7:
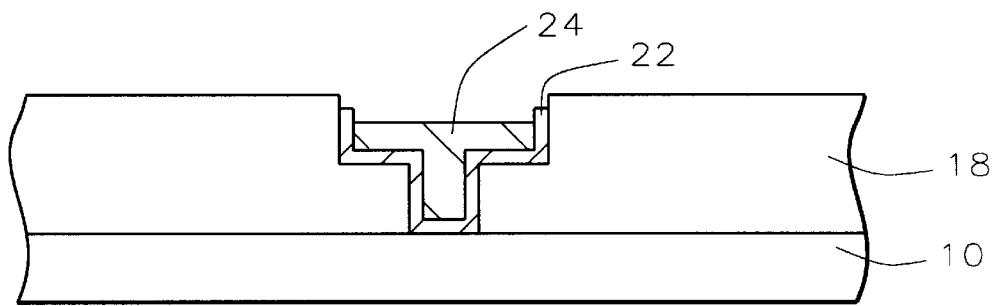
FIGS. 7 through 10 schematically illustrate in cross-sectional representation a first preferred embodiment of the present invention.
Figure 8:
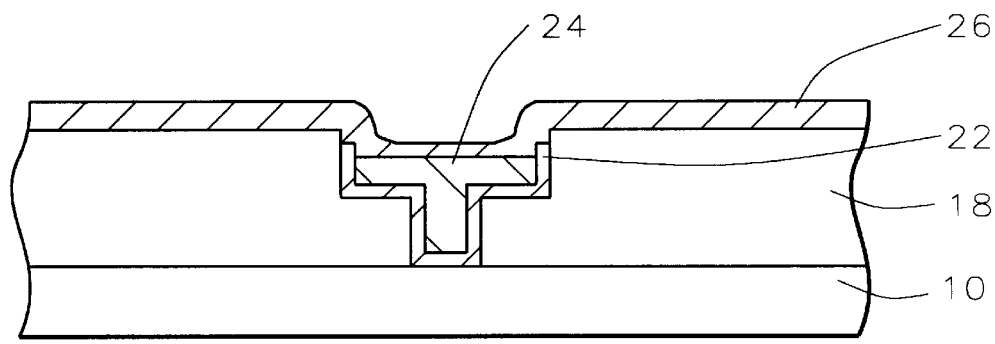

Referring now more particularly to FIGS. 7–10, the first embodiment of the present invention for forming a capping layer over the first copper metallization will be described. Referring now to FIG. 7, a blanket plasma etch back of the barrier metal layer 22 is performed to remove the barrier metal layer from the surface of the IMD or ILD layer 18. For example, this etch back may use a chlorine or fluorine plasma to etch selective to the barrier metal. Removing the excess barrier metal at this point reduces corner protrusion during subsequent processing.

After cleaning, a conductive capping layer is deposited over the IMD or ILD layer 18 and the copper layer 24 recessed within the trench. The capping layer 26 will prevent the underlying copper 24 from being sputtered onto the IMD layer during later reactive ion etching (RIE). There are a number of requirements for the capping layer 26. Its etch by-product formed during etching of the overlying IMD layer should be easily removable by conventional cleaning methodology. The layer 26 should bear the properties of the barrier metal 22 to serve as a top diffusion/oxidation barrier for the copper trenches. Its thickness should be enough for the via to land on without gouging into the underlying copper 24. Tantalum or a tantalum compound, titanium or a titanium compound, or tungsten or a tungsten compound, and other suitable materials can be used for the capping layer 26. Its thickness is preferably between about 100 and 4000 Angstroms.

Now, the conductive capping material is to be removed except where it covers the copper layer 24 within the trench. In this embodiment of the invention, this is accomplished according to the following steps.

Figure 9:
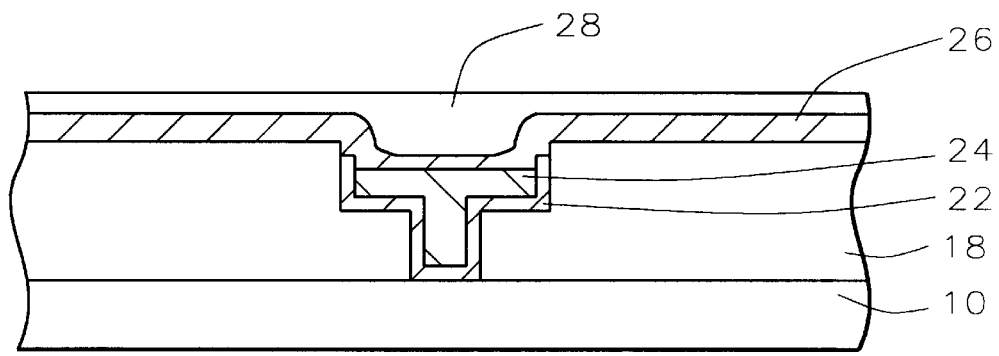

A spin-on material 28 is coated over the conductive barrier layer 26 to a thickness of between about 100 and 4000 Angstroms, as illustrated in FIG. 9. This spin-on material may comprise a barrier and anti-reflective coating (BARC) layer, or resist, or any other suitable material that can fill in the recess, form a planarized layer, and offer protection to the conductive capping layer on the trench during the subsequent plasma etch.

Figure 10:
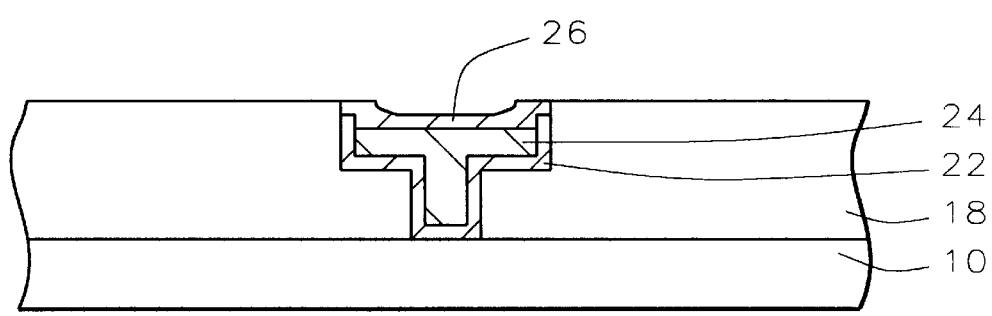

Next, as shown in FIG. 10, a blanket etch back and stripping off of the capping layer and the spin-on material is performed. The conductive cap and the thin layer of spin-on material above the field area are etched away by a chlorine or fluorine plasma, leaving the thicker spin-on material and conductive cap above the trenches. The purpose of creating the recess A, as shown in FIG. 6, becomes obvious. It is to give enough margin during the blanket etch back so that enough conductive cap material 26 will remain on the trenches. After etching back, the remainder of the spin-on material 28 can be stripped off by an $O_2$ plasma or by a forming gas plasma.

Referring now more particularly to FIGS. 7, 8, 11, and 12, the second embodiment of the present invention for forming a capping layer over the first copper metallization will be described. As described above and as shown in FIG. 7, a blanket plasma etch back of the barrier metal layer 22 is performed to remove the barrier metal layer from the surface of the IMD or ILD layer 18.

After cleaning, the conductive capping layer 26 is deposited over the IMD or ILD layer 18 and the copper layer 24 recessed within the trench, as described above and as shown in FIG. 8.

Now, the conductive capping material is to be removed except where it covers the copper layer 24 within the trench. In this embodiment of the invention, this is accomplished according to the following steps.

Figure 11:
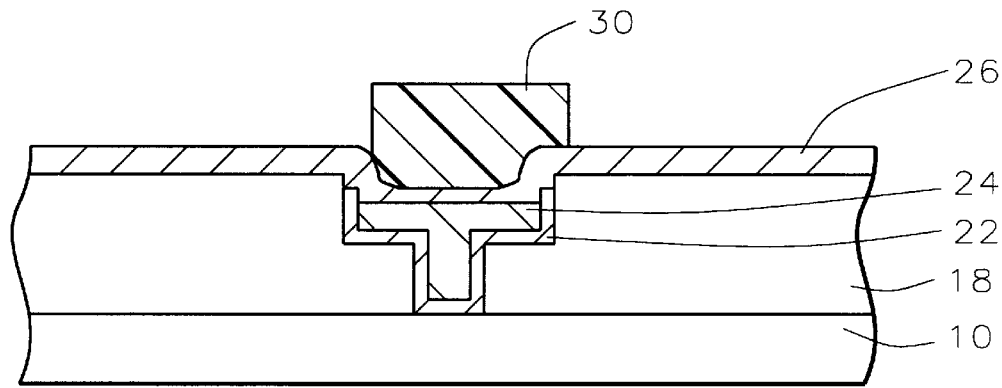
Figure 12:
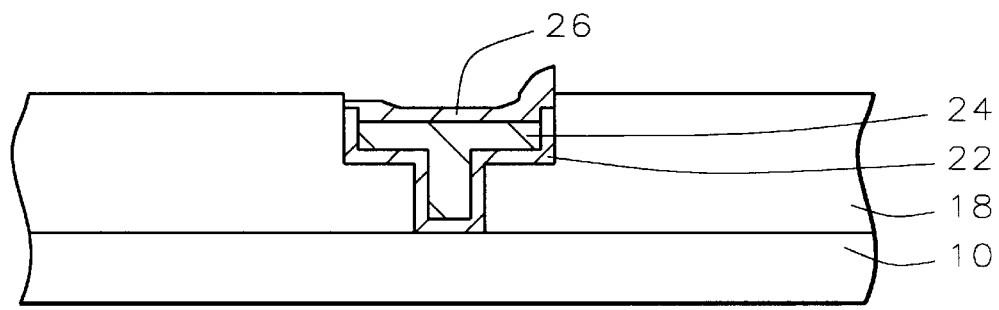

Referring now to FIG. 11, a layer of photoresist is coated over the substrate and patterned to form a photomask 30, using a reverse mask or by using a reverse tone resist. The purpose of creating the recess A, as shown in FIG. 6, becomes obvious. It is to give enough margin during the overlay of the mask so that even if there is misalignment of the mask, as shown in FIG. 10, there is still enough conductive cap material on the trenches after etch back.

As shown in FIG. 11, the conductive cap layer 26 is etched away where it is not covered by the mask 30, using a Cl or F plasma. After etching, the remaining resist can be stripped off using an $O_2$ plasma or a forming gas plasma.

Figure 13:
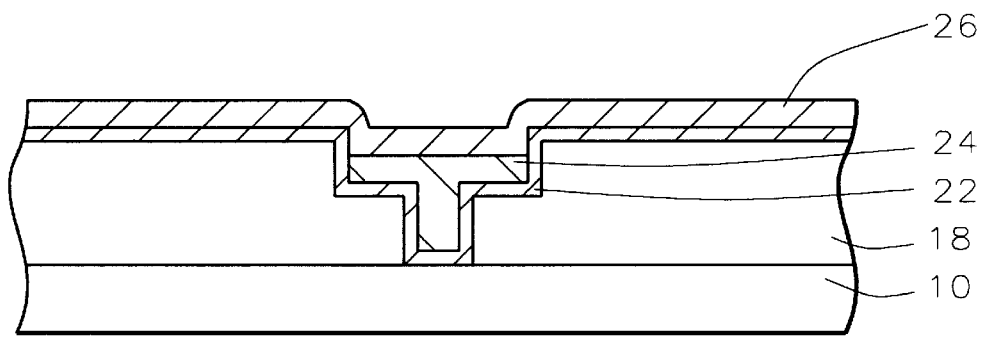
FIGS. 13 through 15 schematically illustrate in cross-sectional representation a third preferred embodiment of the present invention.
Figure 14:
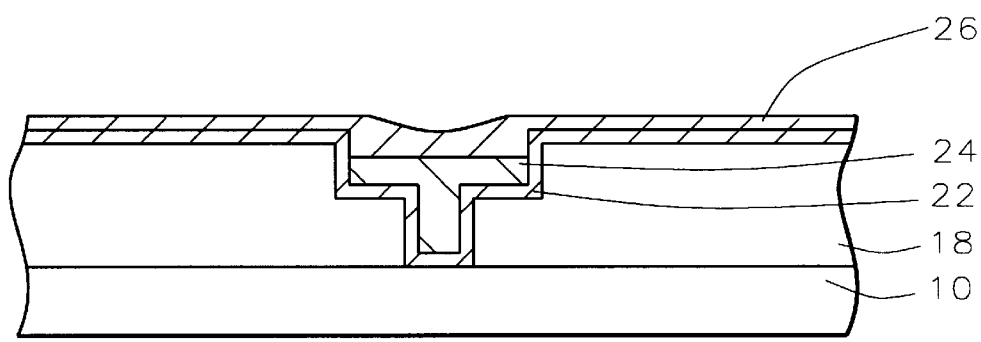
Figure 15:
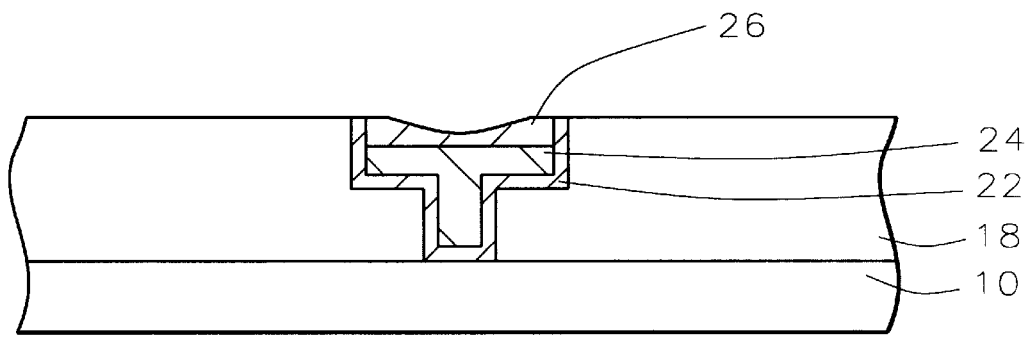

Referring now more particularly to FIGS. 13–15, the third embodiment of the present invention for forming a capping layer over the first copper metallization will be described. After the recess A has been formed in FIG. 6, the conductive capping layer 26 is deposited over the IMD or ILD layer 12 and the copper layer 24 recessed within the trench, as described above and as shown in FIG. 13.

Now, the conductive capping material is to be removed except where it covers the copper layer 24 within the trench. In this embodiment of the invention, this is accomplished according to the following steps.

Referring now to FIG. 14, a partial CMP of the conductive cap layer 26 is performed. The conductive cap layer is partially removed in such a way that the conductive cap material over the trenches is much thicker than in the field areas. This is a time mode CMP process, depending upon the thickness of the layer 26 and the CMP rate.

Now, a blanket etch back of the conductive cap layer is performed using Cl or F plasma. The conductive cap layer above the field area is etched away along with the barrier metal layer 22 above the field areas. This step is like a CMP over-polish process. As shown in FIG. 15, the conductive cap 26 remains only above the trenches.

Figure 16:
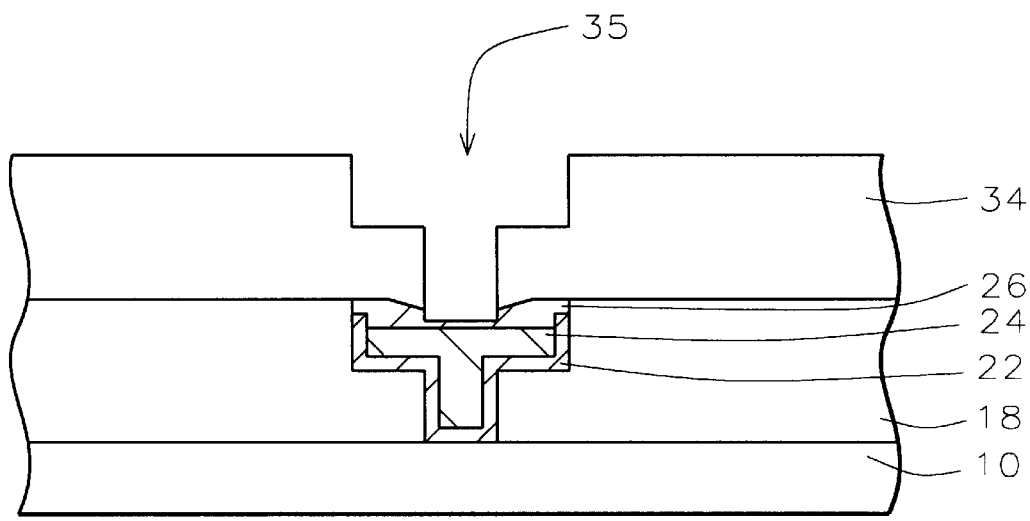
FIGS. 16 and 17 schematically illustrate in cross-sectional representation the completion of the metallization process of the present invention.

After the conductive capping layer 26 has been formed over the first copper metallization according to one of the three preferred embodiments described above, another intermetal dielectric (IMD) layer 34 is deposited over the first copper metallization, as shown in FIG. 16. A via or a dual damascene opening 35 is made through the IMD layer 34 to the first metallization. The conductive cap layer 26 will be contacted by the opening 35. The capping layer 26 prevents sputtering of copper from the trench 24 onto the sidewalls of the opening 35, thus preventing contamination of the IMD layer 34. Since the cap 26 is a conductive layer, it is not necessary to expose the underlying copper in order to provide an electrical connection.

Figure 17:
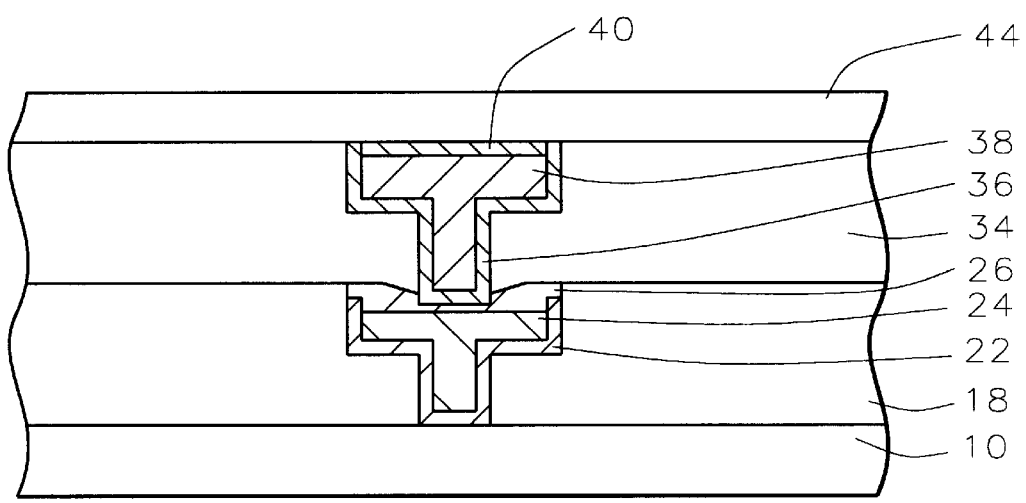

Processing continues to complete the second level metallization by depositing a barrier layer 36 and copper layer 38, as shown in FIG. 17. If a further level of metallization, not shown, is to be made, the process of the invention for forming a conductive capping layer 40 on the copper layer 38 should be used. Passivation layer 44 completes the integrated circuit device. The process of the present invention provides a method for preventing contamination of an intermetal dielectric layer by an underlying copper layer during via or dual damascene etching. Three preferred embodiments for completing the conductive capping layer of the present invention have been described.

While the invention has been particularly shown and described with reference to the preferred embodiments thereof, it will be understood by those skilled in the art that various changes in form and details may be made without departing from the spirit and scope of the invention.

What is claimed is:

1. A method of preventing copper contamination of an intermetal dielectric layer during via or dual damascene etching in the fabrication of an integrated circuit device comprising:

forming a first copper metallization in a dielectric layer overlying a semiconductor substrate wherein a barrier metal layer is formed underlying said first copper metallization and overlying said dielectric layer;

planarizing said first copper metallization;

etching said first copper metallization to form a recess below the surface of said dielectric layer;

removing said barrier metal layer overlying said dielectric layer;

depositing a conductive capping layer overlying said first copper metallization within said recess and overlying said dielectric layer;

coating a spin-on material overlying said conductive capping layer;

etching back said spin-on material and said conductive capping layer over said dielectric layer;

thereafter removing all of said spin-on material leaving said conductive capping layer only over said first copper metallization in said recess;

depositing said intermetal dielectric layer overlying said dielectric layer and said conductive capping layer overlying said first copper metallization;

etching said via or dual damascene opening through said intermetal dielectric layer to said conductive capping layer wherein said conductive capping layer prevents copper contamination of said intermetal dielectric layer during said etching; and filling said via or dual damascene opening with a metal layer to complete electrical connections in the fabrication of said integrated circuit device.

2. The method according to claim 1 wherein said barrier metal layer comprises one of the group containing:

tantalum, tantalum compounds, titanium, titanium compounds, tungsten, and tungsten compounds.

3. The method according to claim 1 wherein said step of planarizing said first copper metallization comprises polishing said first copper metallization using chemical mechanical polishing (CMP) wherein said barrier metal layer is used as a CMP stop layer.

4. The method according to claim 1 wherein said recess is formed by a wet etch method.

5. The method according to claim 4 wherein said wet etch method comprises $CH_2COOH/NH_4F$ or $DMSO/CCl_4$ chemistry.

6. The method according to claim 1 wherein said step of removing said barrier metal layer comprises etching selective to said barrier metal layer using Cl or F plasma.

7. The method according to claim 1 wherein said conductive capping layer comprises one of the group containing: tantalum, tantalum compounds, titanium, titanium compounds, tungsten, and tungsten compounds.

8. The method according to claim 1 wherein said step of etching back said spin-on material and said conductive capping layer over said dielectric layer comprises a Cl or F plasma etch.

9. The method according to claim 1 wherein said step of removing said spin-on material comprises stripping in an $O_2$ plasma or forming gas plasma.

10. The method according to claim 1 wherein said step of removing said barrier metal layer is performed before said step of depositing said conductive capping layer.

11. A method of preventing copper contamination of an intermetal dielectric layer during via or dual damascene etching in the fabrication of an integrated circuit device comprising:

forming a first copper metallization in a dielectric layer overlying a semiconductor substrate wherein a barrier metal layer is formed underlying said first copper metallization and overlying said dielectric layer;

planarizing said first copper metallization;

etching said first copper metallization to form a recess below the surface of said dielectric layer;

removing said barrier metal layer overlying said dielectric layer;

depositing a conductive capping layer overlying said first copper metallization within said recess and overlying said dielectric layer;

forming a mask over said first copper metallization area and etching away said conductive capping layer where it is not covered by said mask leaving said conductive capping layer only over said first copper metallization in said recess;

thereafter removing said mask;

depositing said intermetal dielectric layer overlying said dielectric layer and said conductive capping layer overlying said first copper metallization;

etching said via or dual damascene opening through said intermetal dielectric layer to said conductive capping layer wherein said conductive capping layer prevents copper contamination of said intermetal dielectric layer during said etching; and filling said via or dual damascene opening with a metal layer to complete electrical connections in the fabrication of said integrated circuit device.

12. The method according to claim 11 wherein said barrier metal layer comprises one of the group containing: tantalum, tantalum compounds, titanium, titanium compounds, tungsten, and tungsten compounds.

13. The method according to claim 11 wherein said step of planarizing said first copper metallization comprises polishing said first copper metallization using chemical mechanical polishing (CMP) wherein said barrier metal layer is used as a CMP stop layer.

14. The method according to claim 11 wherein said recess is formed by a wet etch method.

15. The method according to claim 14 wherein said wet etch method comprises $CH_2COOH/NH_4F$ or $DMSO/CCl_4$ chemistry.

16. The method according to claim 11 wherein said step of removing said barrier metal layer comprises etching selective to said barrier metal layer using Cl or F plasma.

17. The method according to claim 11 wherein said conductive capping layer comprises one of the group containing: tantalum, tantalum compounds, titanium, titanium compounds, tungsten, and tungsten compounds.

18. The method according to claim 11 wherein said step of forming said mask comprises using a reverse of a mask used to form said first copper metallization area.

19. The method according to claim 11 wherein said step of forming said mask comprises using a mask used to form said first copper metallization area and a reverse tone resist.

20. The method according to claim 11 wherein said step of etching away said conductive capping layer comprises a Cl or F plasma etch.

21. The method according to claim 11 wherein said step of removing said barrier metal layer is performed before said step of depositing said conductive capping layer.

22. A method of preventing copper contamination of an intermetal dielectric layer during via or dual damascene etching in the fabrication of an integrated circuit device comprising:

forming a first copper metallization in a dielectric layer overlying a semiconductor substrate wherein a barrier metal layer is formed underlying said first copper metallization and overlying said dielectric layer;

planarizing said first copper metallization;

etching said first copper metallization to form a recess below the surface of said dielectric layer;

depositing a conductive capping layer overlying said first copper metallization within said recess and overlying said dielectric layer;

partially polishing away said conductive capping layer wherein said conductive capping layer over said first copper metallization is thicker than said conductive capping layer over said dielectric layer;

thereafter etching back said conductive capping layer and said barrier metal layer overlying said dielectric layer leaving said conductive capping layer only over said first copper metallization within said recess;

depositing said intermetal dielectric layer overlying said dielectric layer and said conductive capping layer overlying said first copper metallization;

etching said via or dual damascene opening through said intermetal dielectric layer to said conductive capping layer wherein said conductive capping layer prevents copper contamination of said intermetal dielectric layer during said etching; and filling said via or dual damascene opening with a metal layer to complete electrical connections in the fabrication of said integrated circuit device.

23. The method according to claim 22 wherein said barrier metal layer comprises one of the group containing: tantalum, tantalum compounds, titanium, titanium compounds, tungsten, and tungsten compounds.

24. The method according to claim 22 wherein said step of planarizing said first copper metallization comprises polishing said first copper metallization using chemical mechanical polishing (CMP) wherein said barrier metal layer is used as a CMP stop layer.

25. The method according to claim 22 wherein said recess is formed by a wet etch method.

26. The method according to claim 24 wherein said wet etch method comprises $CH_2COOH/NH_4F$ or $DMSO/CCl_4$ chemistry.

27. The method according to claim 22 wherein said conductive capping layer comprises one of the group containing: tantalum, tantalum compounds, titanium, titanium compounds, tungsten, and tungsten compounds.

28. The method according to claim 22 wherein said step of etching away said conductive capping layer and said barrier metal layer comprises a Cl or F plasma etch.

* * * * *

UNITED STATES PATENT AND TRADEMARK OFFICE
CERTIFICATE OF CORRECTION

PATENT NO. : 6,114,243
DATED : September 5, 2000
INVENTOR(S) : Subhash Gupta, Kwok Keung Paul Ho, Mei-Sheng Zhou, Simon Chooi It is certified that error appears in the above-identified patent and that said Letters Patent is hereby corrected as shown below:

On the Title page, in item (75), please delete "Simon Chool" and replace it with --Simon Chooi--.

Signed and Sealed this

First Day of May, 2001

Attest:

NICHOLAS P. GODICI

*Attesting Officer*     Acting Director of the United States Patent and Trademark Office